(12) United States Patent
Whetsel et al.

(10) Patent No.: US 7,437,639 B2
(45) Date of Patent: Oct. 14, 2008

(54) RESPONSE BITS AS STIMULUS IN SUBDIVIDED SCAN PATH DELAY TEST

(75) Inventors: Lee D. Whetsel, Allen, TX (US); Joel J. Graber, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 460 days.

(21) Appl. No.: 11/103,783

(22) Filed: Apr. 11, 2005

(65) Prior Publication Data

US 2005/0204228 A1 Sep. 15, 2005

Related U.S. Application Data

(62) Division of application No. 09/955,542, filed on Sep. 18, 2001, now Pat. No. 6,898,749.

(60) Provisional application No. 60/234,083, filed on Sep. 20, 2000.

(51) Int. Cl.
*G01R 31/28* (2006.01)

(52) U.S. Cl. ................................................ 714/729

(58) Field of Classification Search ............... 714/726, 714/729
See application file for complete search history.

(56) References Cited

U.S. PATENT DOCUMENTS

| | | | | |
|---|---|---|---|---|
| 5,347,523 A * | 9/1994 | Khatri et al. | ............... | 714/730 |
| 5,574,733 A * | 11/1996 | Kim | ........................ | 714/728 |
| 5,606,568 A * | 2/1997 | Sudweeks | ................ | 714/729 |
| 5,717,702 A * | 2/1998 | Stokes et al. | ............... | 714/730 |
| 6,401,226 B1 * | 6/2002 | Maeno | ..................... | 714/728 |
| 6,516,432 B1 * | 2/2003 | Motika et al. | .............. | 714/732 |

* cited by examiner

*Primary Examiner*—James C Kerveros
(74) *Attorney, Agent, or Firm*—Lawrence J. Bassuk; W. James Brady; Frederick J. Telecky, Jr.

(57) ABSTRACT

Scan and Scan-BIST architectures are commonly used to test digital circuitry in integrated circuits. The present invention improves upon low power Scan and Scan-BIST methods. The improvement allows the low power Scan and Scan-BIST architectures to achieve a delay test capability equally as effective as the delay test capabilities used in conventional scan and Scan-BIST architectures.

3 Claims, 4 Drawing Sheets

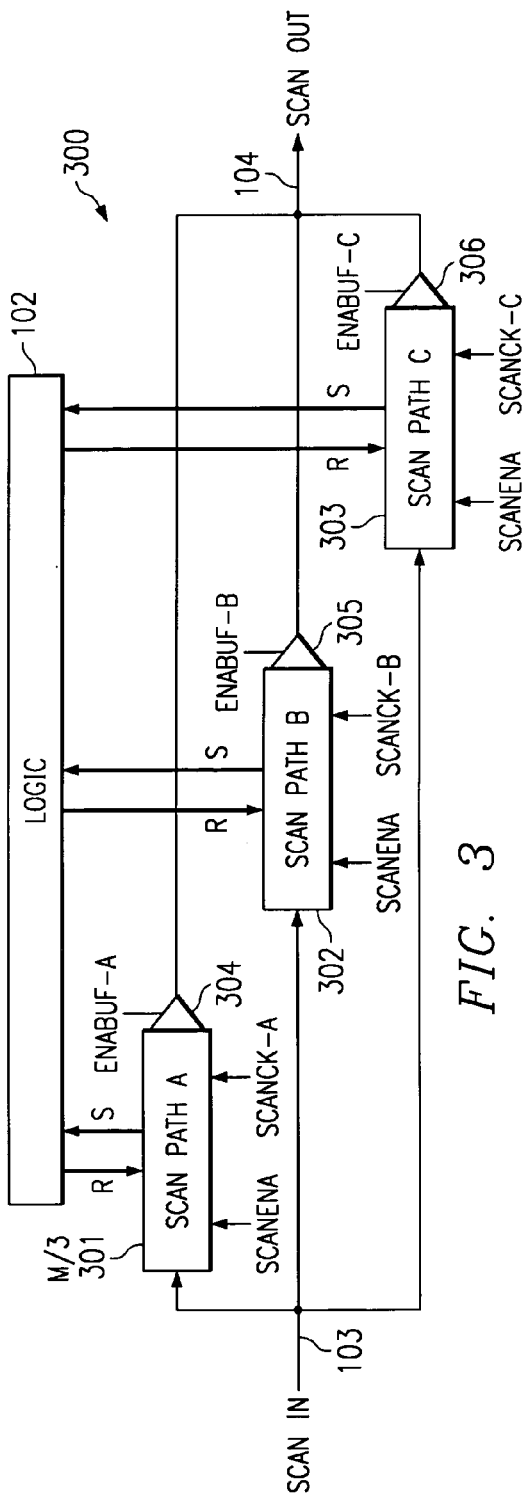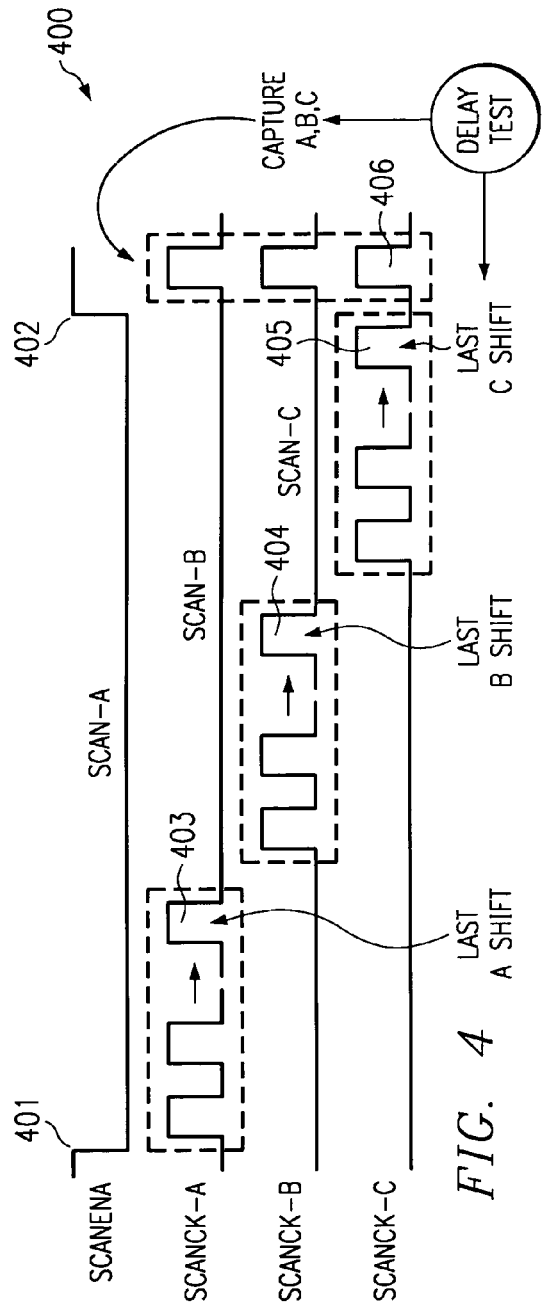
FIG. 3
FIG. 4

RESPONSE BITS AS STIMULUS IN SUBDIVIDED SCAN PATH DELAY TEST

CROSS-REFERENCE TO RELATED APPLICATIONS

This application is a divisional of prior application Ser. No. 09/955,542, filed Sep. 18, 2001, now U.S. Pat. No. 6,898,749, issued May 24, 2005;

which claims priority under 35 USC 119(e) (1) of provisional application Ser. No. 60/234,083, filed Sep. 20, 2000.

The disclosure extends upon and incorporates herein by reference patent application Ser. No. 09/803,599, filed Mar. 9, 2001 "Adapting Scan Architectures for Low Power Operation", now U.S. 6,769,080, issued Jul. 27, 2004, and patent application Ser. No. 09/803,608, filed Mar. 9, 2001 "Adapting Scan-BIST Architectures for Low Power Operation", now U.S. Pat. No. 6,763,488, issued Jul. 13, 2004.

BACKGROUND OF THE INVENTION

1. Field of the Invention

Serial scan and Scan-BIST (Built In Self Test) architectures are commonly used to test digital circuitry in integrated circuits. The present invention improves upon the previously described low power Scan and Scan-BIST methods. These previously described methods use split scan paths to reduce power consumption. The disclosed improvement provides for the referenced low power Scan and Scan-BIST architectures to achieve a delay test capability equally as effective as the delay test capabilities used in conventional scan and Scan-BIST architectures. A delay test captures a response from the logic circuit a clock time after application of a stimulus.

2. Description of Related Art

In FIG. 1, a circuit 100 includes a conventional scan architecture configured for a test. In the normal functional configuration, circuit 100 may be a functional circuit within an IC, but in test configuration it appears as shown in FIG. 1. Scan architectures can be applied at various circuit levels. For example, the scan architecture of FIG. 1 may represent the testing of a complete IC, or it may represent the testing of an embedded intellectual property core sub-circuit within an IC, such as a DSP or CPU core sub-circuit.

The scan architecture includes an M-bit scan path 101, logic circuitry 102 to be tested, scan input 103, scan output 104, scan enable (SCANENA) 105, scan clock (SCANCK) 106, logic response outputs 107, and logic stimulus inputs 108. During scan testing, a tester or an embedded control circuit in the IC outputs SCANCK and SCANENA control signals to cause scan path 101 to repeat the operations of; (1) capturing data from logic 102 via response bus 107, and (2) scanning data through scan path 101 from scan input 103 to scan output 104. During the scan operation, the stimulus outputs 108 from scan path 101 ripple, which causes the inputs to logic 102 to actively change state. Rippling the inputs to logic 102 causes power to be consumed by the interconnect and gating capacitance of the circuits in logic 102.

In FIG. 2, a timing diagram example 200 depicts the signals used in the above described scan and capture operations. During scan operation, SCANENA is low from time 204 to 205 and M SCANCKs 201-202 are applied to shift data through the scan path 101. During capture operation, SCANENA is high and a SCANCK 203 is applied to capture response data into the scan path 101. Logical testing of logic 102 is achieved by inputting stimulus and capturing response. Delay testing of logic 102 is achieved by capturing the response data, via SCANCK 203, immediately following the last scan-in operation that occurs at SCANCK 202. For example, the last shift operation at SCANCK 202 moves or shifts all the stimulus inputs 108 to logic 102 one bit position, which causes the logic 102 to transition to output the final response 107 to scan path 101. The subsequent SCANCK 203 captures this final response transition into scan path 101. Thus the delay test is achieved by having the logic respond to a last stimulus transition during SCANCK 202 to output a last response pattern which is captured into scan path 101 during SCANCK 203. This form of scan path delay testing is well known.

Low Power Scan Adaptation Overview

In FIG. 3, a low power scan architecture 300 adaptation of the FIG. 1 scan path architecture is arranged according to the scan architectures described in the referenced patent application Ser. Nos. 09/803,588 and 09/803,608. As described in the referenced patent applications, the process of adapting scan architectures for low power operation is advantageously achieved without having to insert blocking circuitry in the stimulus paths, which increases overhead and adds delays, and without having to decrease the scan clock rate which increases test time. Furthermore, as described in the referenced applications, the process of adapting scan architectures for low power operation is advantageously achieved without having to modify the stimulus and response test patterns that are automatically produced by scan architecture synthesis tools.

Adapting the conventional scan path architecture 100 of FIG. 1 into the low power scan path architecture 300 of FIG. 3 involves reorganizing scan path 101 from being a single scan path containing all the scan cells (M), into a scan path having a desired number of separate scan paths. In FIG. 3, scan path 101 is shown after having been reorganized into three separate scan paths A, B, and C 301-303. For simplification, it is assumed that the number of scan cells (M) in the conventional scan path 101 of FIG. 1 is divisible by three such that each of the three separate scan paths A, B, and C of FIG. 3 contains an equal number of scan cells (M/3).

The serial input of each scan path A, B, and C is commonly connected to scan input 103. The serial output of scan path A is connected to the input of a 3-state buffer 304, the serial output of scan path B is connected to the input of a 3-state buffer 305, and the serial output of scan path C is connected to the input of a 3-state buffer 306. The outputs of the 3-state buffers 304-306 are commonly connected to scan output 104. Scan paths A, B, and C each output an equal number of parallel stimulus inputs (S) to logic 102, and each input an equal number of parallel response outputs (R) from logic 102. The number of stimulus output signals to logic 102 in from the scan architectures in FIGS. 1 and 3 is the same, and the number of response input signals from logic 102 in FIGS. 1 and 3 is the same.

Scan paths A-C and buffers 304-306 receive control input from an adaptor circuit which was described in detail in the referenced patent applications. These control inputs are labeled in FIG. 3 as; SCANENA, SCANCK-A, SCANCK-B, SCANCK-C, ENABUF-A, ENABUF-B, and ENABUF-C. Alternatively, these control inputs could be provided from IC pins/pads being driven by a tester, instead of from an adaptor circuit.

In FIG. 4, a timing diagram example 400 depicts the operation of the low power scan path of FIG. 3. As seen in the timing diagram, each scan operation, which begins at time 401 and ends at time 402, is broken up into a sequence of three sub-scan operations. The first sub-scan operation enables buffer 304 via ENABUF-A and shifts M/3 bits of data through Scan Path A 301 in response to the SCANCK-A's. The second sub-scan operation enables buffer 305 via ENABUF-B and shifts M/3 bits of data through Scan Path B 302 in response to the SCANCK-B's. The third sub-scan operation enables buffer 306 via ENABUF-C and shifts data through Scan Path C 303 in response to the SCANCK-C's. The effect of these sub-scan operations, as previously described in the referenced patent applications, is to reduce the number of simultaneously rippling stimulus inputs to logic 102 from M in FIG. 1 to M/3 in FIG. 3. Rippling only portions (M/3) of the overall stimulus input (M) to logic 102 advantageously reduces power consumption in logic 102 during scan operations.

From the signal timings in FIG. 4 it is seen that at the end of the sequence of sub-scan operations, at time 402, the SCANCKs-A, B, and C of Scan Paths A, B, and C are enabled at time 406 to capture response data into Scan Paths A, B, and C. During the sub-scan sequence, Scan Path A stops shifting data following SCANCK-A at time 403, Scan Path B stops shifting data following SCANCK-B at time 404, and Scan Path C stops shifting data following SCANCK-C at time 405. Since the response capture clock at time 406 occurs immediately after scan clock time 405, the logic portion of logic 102 stimulated by the last shift of Scan Path C does a delay test as described previously in regard to FIGS. 1 and 2. However, since the response capture clock time 406 does not occur immediately after the last shift time of Scan Path A and C, at times 403 and 404 respectively, it is not possible, with the timing shown in FIG. 4, to do delay testing of the logic portions of logic 102 that are stimulated by the last shift operations of Scan Paths A and B.

BRIEF SUMMARY OF THE INVENTION

The present invention provides the addition of a second capture clock at a time that immediately follows the original capture clock.

Alternatively, a first cache bit memory, in this example a D flip flop (FF), can be inserted between the scan input lead and the serial input to scan path A, and a second cache bit memory, again in this example a D flip flop (FF), can be inserted between the scan input lead and the serial input to scan path B. When scan path A is serially loaded, the last bit remains in the first cache bit memory. Likewise, when scan path B is serially loaded, the last bit remains in the second cache bit memory. When scan path C is serially loaded and when the last bit is loaded into the scan path C, the last bits in the first and second cache bit memories are simultaneously loaded into their respective scan paths A and B. This presents the desired stimulus signals to the logic circuits. The next clock signal then captures the response from the logic circuits.

BRIEF DESCRIPTION OF THE SEVERAL VIEWS OF THE DRAWINGS

FIG. 3 is a block diagram of the scan architecture coupled to a logic circuit in an integrated circuit disclosed in the two referenced patent applications.

FIG. 4 is a timing diagram of the signals used in the scan architecture of FIG. 3.

DETAILED DESCRIPTION OF THE INVENTION

Figure 5:
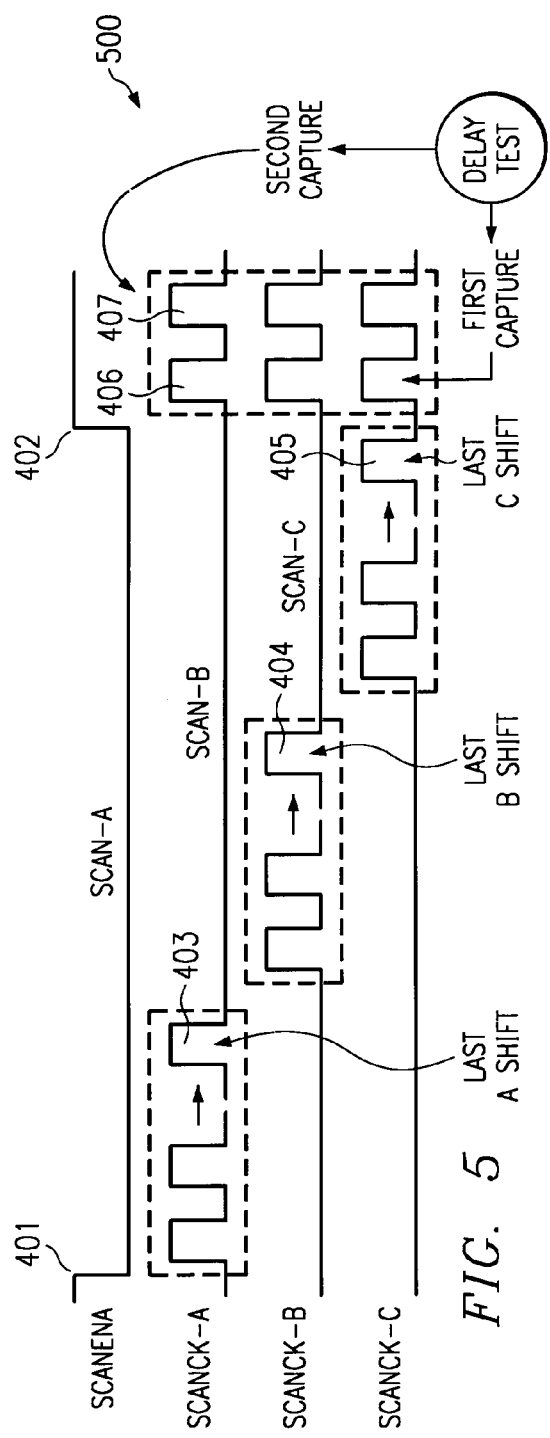
FIG. 5 is a timing diagram of the signals used in the scan architecture of FIG. 3 including the additional signals of the present invention.

FIG. 5 illustrates the timing diagram 500 of FIG. 4 modified to allow for delay testing using the low power scan architecture of FIG. 3. The modification is simply the addition of a second capture clock at time 407 that immediately follows the original capture clock at time 406. Operating the low power scan architecture of FIG. 3 using the timing diagram of FIG. 5 enables a delay test of logic 102. The delay test occurs by using the response data captured by the original capture clock at time 406 as delay test stimulus data to produce the response data captured by the second capture clock at time 407. While this approach does provide the previously described low power scan architecture with a delay test capability, it requires that the test patterns, which were originally produced for the conventional scan path architecture of FIG. 1, to be modified for use by the low power scan path architecture of FIG. 3 when it is operated according to the timing diagram shown in FIG. 5. As mentioned in the referenced patent applications, being able to re-use the original test patterns when converting a conventional scan path architecture into a low power scan architecture is a desired objective.

Figure 1:
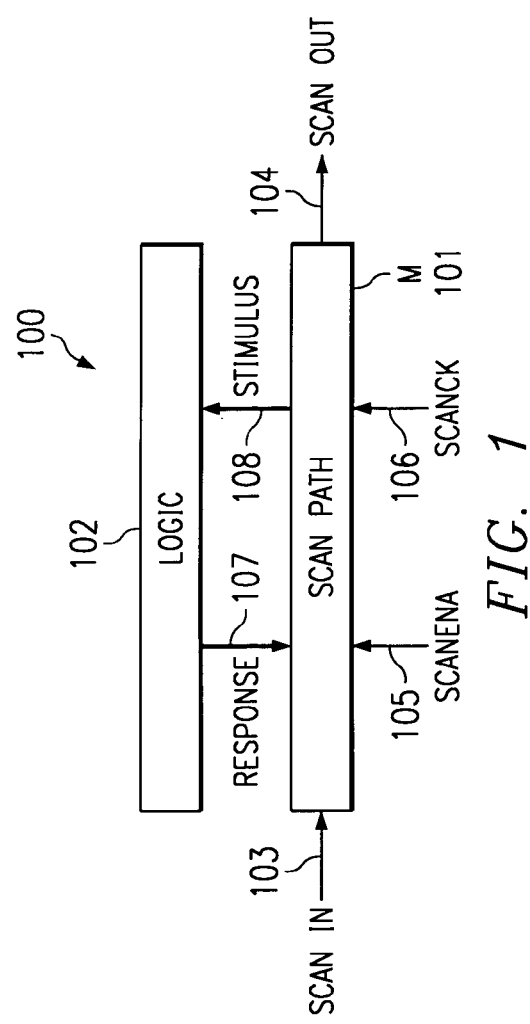
FIG. 1 is a block diagram of a scan architecture coupled to a logic circuit in an integrated circuit.
Figure 2:
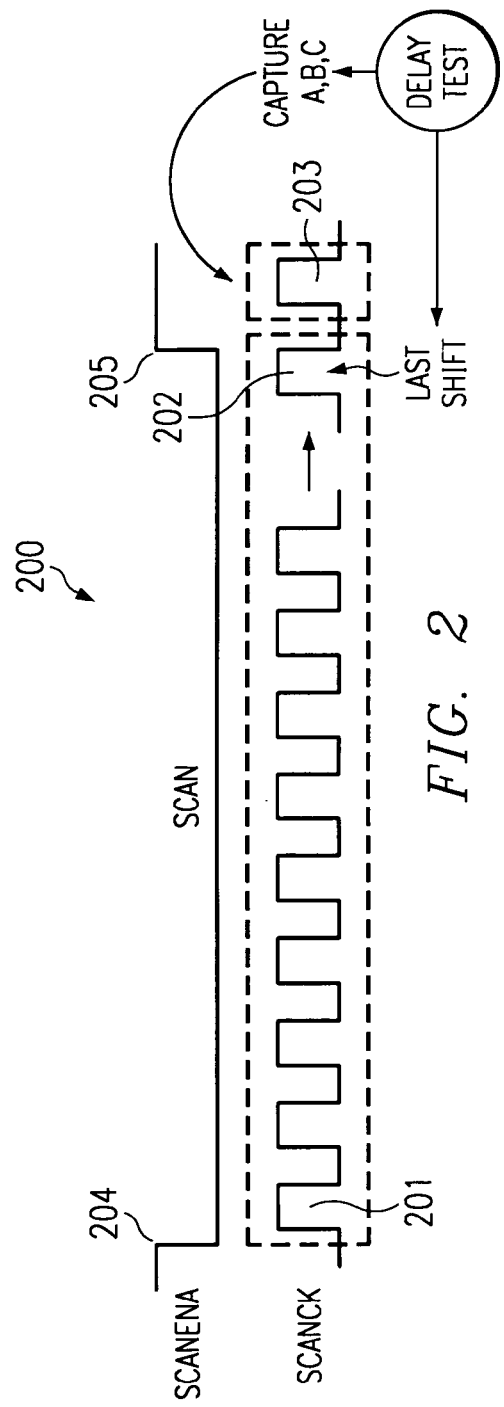
FIG. 2 is a timing diagram of signals used in the scan architecture of FIG. 1.

The architecture 600 illustrates how the low power scan path architecture of FIG. 3 may be modified into an architecture with a delay test capability that does not require modifying the original test patterns of the conventional scan path architecture of FIG. 1. Like the low power scan path architecture of FIG. 3, architecture 600 includes a Scan Path A 301, a Scan Path B 302, a Scan Path C 303, and associated 3-state buffers 304-306 connected to Scan Out 104. Also like the low power scan path of FIG. 3, the Scan Paths A, B, and C of FIG. 6 are controlled by a SCANENA signal and SCANCK's A, B, and C.

The difference between the low power scan architectures 300 and 600 is that a first cache bit memory, in this example a D flip flop (FF) 601, has been inserted between the Scan Input 103 lead and the serial input to Scan Path A, and a second cache bit memory, again in this example a D flip flop (FF) 605, has been inserted between the Scan Input 103 lead and the serial input to Scan Path B. The D inputs of both FF 601 and 605 are connected to the Scan Input 103. The Q output 604 of FF 601 is connected to the serial input of Scan Path A. The Q output 607 of FF 605 is connected to the serial input of Scan Path B. The clock input 603 of FF 601 is connected to SCANCK-A and the clock input 606 of FF 605 is connected to SCANCK-B.

Figure 7:
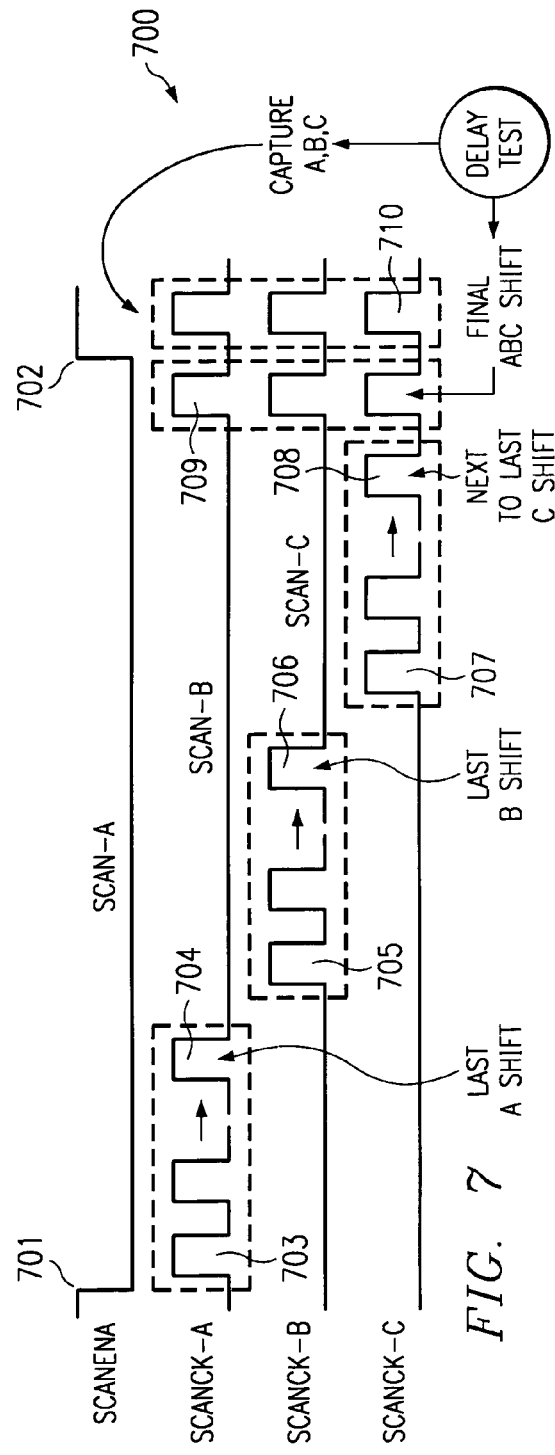
FIG. 7 is a timing diagram of the signals used in the scan architecture of FIG. 6 including the additional signals of the present invention.
Figure 6:
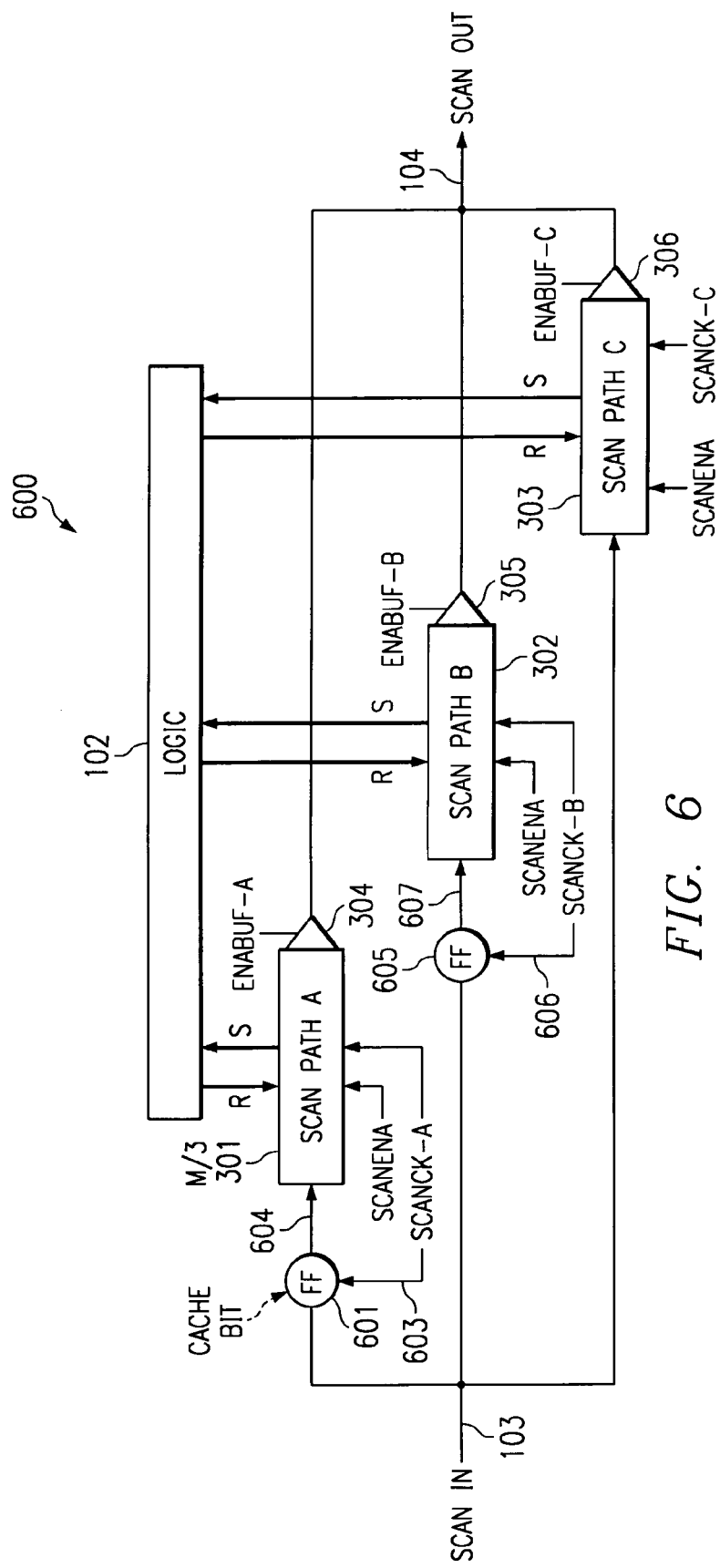
FIG. 6 is a block diagram of a scan architecture coupled to a logic circuit in an integrated circuit that includes the present invention.

The timing diagram 700 of FIG. 7 illustrates the operation of the low power scan architecture 600 of FIG. 6. At time 701, the SCANENA signal goes low to initiate the low power scan operation. From time 703 to time 704, buffer 304 is enabled and M/3 SCANCK-A's shift data through FF 601 and Scan Path A 301 from Scan Input 103 to Scan Output 104. During this shift operation the data contained in Scan Path A is completely shifted out via Scan Output 104. However, during this shift operation, the last bit to be shifted into Scan Path A from Scan Input 103 is left stored in FF 601.

From time 705 to time 706, buffer 305 is enabled and M/3 SCANCK-B's shift data through FF 605 and Scan Path B 302 from Scan Input 103 to Scan Output 104. During this shift operation the data contained in Scan Path B is completely shifted out via Scan Output 104. However, during this shift operation the last bit to be shifted into Scan Path B from Scan Input 103 is left stored in FF 605.

From time 707 to time 708, buffer 306 is enabled and [(M/3)-1] SCANCK-C's shift data through Scan Path C 303 from Scan Input 103 to Scan Output 104. During this shift operation all the data contained in Scan Path C, except for the last data output bit, is shifted out via Scan Output 104. Also during this shift operation, all the data to be loaded into Scan Path C, except for the last input bit, is shifted in via Scan Input 103.

At time 709, buffer 306 remains enabled and all SCAN-CK's-A, B, and C are activated at once. This simultaneous activation of SCANCK's A, B and C causes; (1) the last scan input bit stored in FF's 601 and 605 to be shifted into Scan Paths A and B respectively, (2) the last input bit from Scan Input 103 to be clocked into Scan Path C, and (3) the last output bit from Scan Path C to be clocked out onto Scan Output 104. This shift operation causes all the stimulus outputs from Scan Path A, B, and C to logic 102 to transition by one bit. Following this shift operation, buffer 306 is disabled.

At time 702 SCANENA goes high to terminate the above described low power shift operation and prepare for the capture operation. At time 710, all SCANCK's A, B, and C are simultaneously activated to capture the response data from the last shift operation that occurred at time 709. The above described low power shift and capture operations are repeated until the logic 102 has been tested.

Since all stimulus bit inputs to logic 102 transition in response to the simultaneously activated SCANCK's A, B, and C at time 709, the response data captured at time 710 provides a "last shift to capture" delay test which is identical to the "last shift to capture" delay test described previously in regard to the conventional scan path architecture 100. Thus a low power scan architecture with delay test capability is provided by the present invention. The scan and delay test provided by the low power scan architecture 600 can directly re-use the test patterns provided for the conventional scan path architecture 100. Thus the advantage of the low power scan architecture 600 over the low power scan architecture 300 is in its ability to do delay testing using the original test patterns of the pre-adapted conventional scan path architecture 100.

The above process of scanning and capturing data into the low power scan architecture 600 can be summarized in the following steps.

Step 1—Enable Scan Path A* output, then Do M/3 shifts of Scan Path A*

Step 2—Enable Scan Path B* output, then Do M/3 shifts of Scan Path B*

Step 3—Enable Scan Path C output, then Do [(M/3)-1] shifts of Scan Path C

Step 4—Enable Scan Path C output, then Do one shift of Scan Paths A*, B*, & C

Step 5—Capture Response Data into Scan Paths A*, B*, & C

Step 6—Repeat Steps 1-5 until test is complete (Note1: A* indicates the serial combination of FF 601 and Scan Path A)

(Note2: B* indicates the serial combination of FF 605 and Scan Path B)

As previously described in the referenced TI patents, the Scan Input 103 can be connected to an IC pin or to an on chip BIST generator circuit, and the Scan Output 104 can be connected to an IC pin or to an on chip BIST compactor circuit.

Also as previously mentioned in the referenced patents, the burst of SCANCK-As, SCANCK-Bs, and SCANCK-Cs occur in a seamless manner such that the scanning of data to and from the low power scan path of circuit 600 via the Scan Input 103 and Scan Output 104 is indistinguishable from the scanning of data to and from the conventional scan path 100 via the Scan Input 103 and Scan Output 104.

The example adaptor circuit described in the referenced patents controlled the low power scan path of architecture 300 by manipulating the SCANCK-A, B, and C signals and the ENABUF-A, B, and C signals according to the timing diagram of FIG. 4. To control the low power scan path of architecture 600 according to the timing diagram of FIG. 7 and process steps 1-5 listed above, the control output from the adaptor circuit would need be modified to appropriately manipulate the SCANCK-A, B, and C and ENABUF-A, B, and C signals. If the SCANCK-A, B, C and ENABUF-A, B, C signals were provided at the pins/pads of an IC, then the tester driving the pins/pads would be programmed to control the signals according the timing diagram of FIG. 7 and process steps 1-5 listed above.

In architecture 600, it should be clear that, while at least a one bit cache memory is required at the inputs of Scan Path A and B, a multiple bit cache memory could be used at the inputs of Scan Paths A and B as well. For example, if a two bit cache memory were used at the inputs of Scan Path A and B, the above process steps would be maintained with the exception that Steps 3 and 4 would be modified as follows:

Step3—Enable Scan Path C output, then Do [(M/3)-2] shifts of Scan Path C

Step4—Enable Scan Path C output, then Do two shifts of Scan Paths A*, B*, & C

Although the present invention has been described in accordance to the embodiments shown in the Figures, one of ordinary skill in the art will recognize there could be variations to these embodiments and those variations should be within the spirit and scope of the present invention. Accordingly, modifications may be made by one ordinarily skilled in the art without departing from the spirit and scope of the appended claims.

What is claimed is:

1. A process of delay testing logic circuitry, comprising:
    A. sequentially and separately shifting respective portions of a test pattern of stimulus bits, originally produced for a contiguous scan path, from a single lead through each of parallel connected, equal length subdivisions of a divided scan path;
    B. applying the stimulus bits from each subdivision of the divided scan path to only a part of the logic circuitry connected to that subdivision while shifting the stimulus bits, the applying causing the logic circuitry of that part to produce binary state response bits, and the shifting of stimulus bits through that subdivision causing the response bits from only that part to change binary states;
    C. capturing simultaneously in all subdivisions of the scan path from all of the parts of the logic circuitry first response bits occurring in response to a previous shift of stimulus bits in each subdivision;
    D. capturing simultaneously in all subdivisions of the scan path from all of the parts of the logic circuitry second response bits occurring in response to applying the first response bits as stimulus bits to the logic circuitry; and
    E. separately and sequentially shifting the captured second response bits from the subdivisions to a single lead of the scan path.

2. The process of claim 1 in which the shifting stimulus bits includes:

i. shifting a first portion of the stimulus bits into a first subdivision of the scan path to cause changes in the binary states of the response bits for only the part of the logic circuitry connected to the first subdivision;

ii. shifting a second portion of the stimulus bits into a second subdivision of the scan path to cause changes in the binary states of the response bits for only the part of the logic circuitry connected to the second subdivision; and iii. shifting a third portion of the stimulus bits into a third subdivision of the scan path to cause changes in the binary states of the response bits for only the part of the logic circuitry connected to the third subdivision.

3. The process of claim 1 in which the shifting the captured second response bits through the scan path includes:

i. shifting a first portion of the second response bits from a first subdivision of the scan path to cause changes in the binary states of the response bits for only the part of the logic circuitry connected to the first subdivision;

ii. shifting a second portion of the second response bits from a second subdivision of the scan path to cause changes in the binary states of the response bits for only the part of the logic circuitry connected to the second subdivision; and iii. shifting a third portion of the second response bits from a third subdivision of the scan path to cause changes in the binary states of the response bits for only the part of the logic circuitry connected to the third subdivision.

* * * * *